United States Patent [19]
Klinger

[11] 4,456,856
[45] Jun. 26, 1984

[54] RESONANT FLYBACK BOOST CIRCUIT

[75] Inventor: Roland W. Klinger, Congers, N.Y.

[73] Assignee: The Bendix Corporation, Teterboro, N.J.

[21] Appl. No.: 511,606

[22] Filed: Jul. 7, 1983

[51] Int. Cl.³ .................... H01J 29/70; H01J 29/76
[52] U.S. Cl. .................................. 315/408; 315/395
[58] Field of Search ............... 315/408, 396, 397, 395, 315/411

[56] References Cited

U.S. PATENT DOCUMENTS 4,164,689 8/1979 Zappala .............................. 315/408
4,400,652 8/1983 Sunderland ........................ 315/408

Primary Examiner—Theodore M. Blum
Attorney, Agent, or Firm—Stanley N. Protigal; Anthony F. Cuoco

[57] ABSTRACT

A resonant flyback boost circuit (21) is used to enchance flyback performance by decreasing the time required for completing flyback on systems using a cathode ray tube and a magnetic deflection coil (11). The boost circuit (21) is parallelly connected across the yoke (11) in order to sense a voltage peak which occurs at the initiation of flyback. The voltage peak is used to initiate a control signal for allowing current to pass from a high voltage source (23) to a supplemental boost capacitor (33). When the potential across the supplemental boost capacitor (33) exceeds the potential across the yoke (11), current flows from the supplemental boost capacitor (33), to an isolating diode (40) to the yoke (11), thereby increasing the current flow through the yoke (11) during the allocated flyback period.

The boost circuit (21) reduces flyback time while maintaining a high input impendance when boost is not being applied. The circuit (21) can be connected to as few as three points, does not require a separate sync pulse and has minimal degrading effect on forward scanning and stroke writing modes of operation.

20 Claims, 3 Drawing Figures

RESONANT FLYBACK BOOST CIRCUIT

BACKGROUND OF THE INVENTION

This invention relates to inductive circuits and, in particular, to video circuitry used to drive a deflection yoke for controlling an electron beam in a cathode ray tube (CRT). More specifically, the invention relates to a flyback boost circuit which enables the deflection yoke to rapidly move the beam from the end of one line trace to the beginning of a subsequent line trace during raster scanning.

A problem inherent in using inductive loads is that rapid changes in current through such a load is met with the characteristic impedance of the load. In order to change the current flow through the load, a substantial increase in potential across the load over a transient time period is necessary in order to effect the change in current rapidly. Some systems using inductive loads must provide power to the load up to a certain maximum amount for the majority of operating time and must provide a substantially increased amount of power to the load for short periods of time. Such circuits include electric motors, and electron beam deflection devices such as video systems which use a magnetic coil deflection yoke.

In certain techniques used to obtain an increase in line resolution at a given frame rate, it is necessary to reduce the time allocated for flyback. In order to accomplish this, flyback boost circuits are used, which increase power to a magnetic deflection yoke in order to cause a rapid change in the yoke's magnetic field. This is because, at higher raster line rates, the time allocated for flyback decreases. If the actual deflection of an electron beam deflected by the yoke lags behind the time allocated for flyback, the result is a distortion on the left side of a screen (assuming a left-to-right horizontal line scan). This would cause the picture to appear stretched or overlapped.

Deflection boost circuits provide the additional energy needed, typically by switching "on" high voltage across the yoke. High voltage switching must be triggered at a certain time and for a certain length of time during flyback. In order to accomplish this, boost circuits usually require high power switching electronics having circuits which control pulse delay and pulse width. One type of prior art boost circuit is triggered by a separate synchronization (sync) pulse. In that system, hardware is usually needed to delay, widen and amplify the sync pulses. Furthermore, such circuits have to be designed to work within a narrow voltage range. If the voltage range is to change, adaptations must be made for the circuit to function as intended.

A further disadvantage of prior art flyback boost circuits occurs when both raster and stroke information are to be displayed. Typically, stroke information is displayed during retrace periods or as a selected alternative to a raster display. Such stroke information involves specific controls of the deflection yoke circuitry and the prior art flyback boost circuits would have to be electrically taken out of the yoke driving amplifiers during such time as stroke writing was used in order to eliminate a degrading effect on the stroke image.

This invention has, as a principle object, decreased flyback time in order to facilitate increased resolution. It is important that circuitry used to increase flyback time not have a degrading effect on a CRT image produced by stroke writing. It is further important that such a circuit be simple enough in design as to not require separate adjustment. It is further desired that such a circuit be adaptable to a wide range of driving voltages and not be required to be provided with a separate sync pulse signal.

SUMMARY OF THE INVENTION

In accordance with the present invention, a boost circuit is provided for driving an inductive load, such as a magnetic deflection yoke for a CRT, in which the load is operated in a resonant mode when rapid changes in current are required. When a driving amplifier driving the load changes driving voltage to the load in order to initiate the change, a high voltage produced by the load's inductance is used to signal a switching amplifier which connects a drive voltage to the load. When voltage to the load goes to a certain level, the switching amplifier is turned off and the load's voltage is allowed to return to a level determined by the driving amplifier.

DETAILED DESCRIPTION OF THE INVENTION

Figure 1:
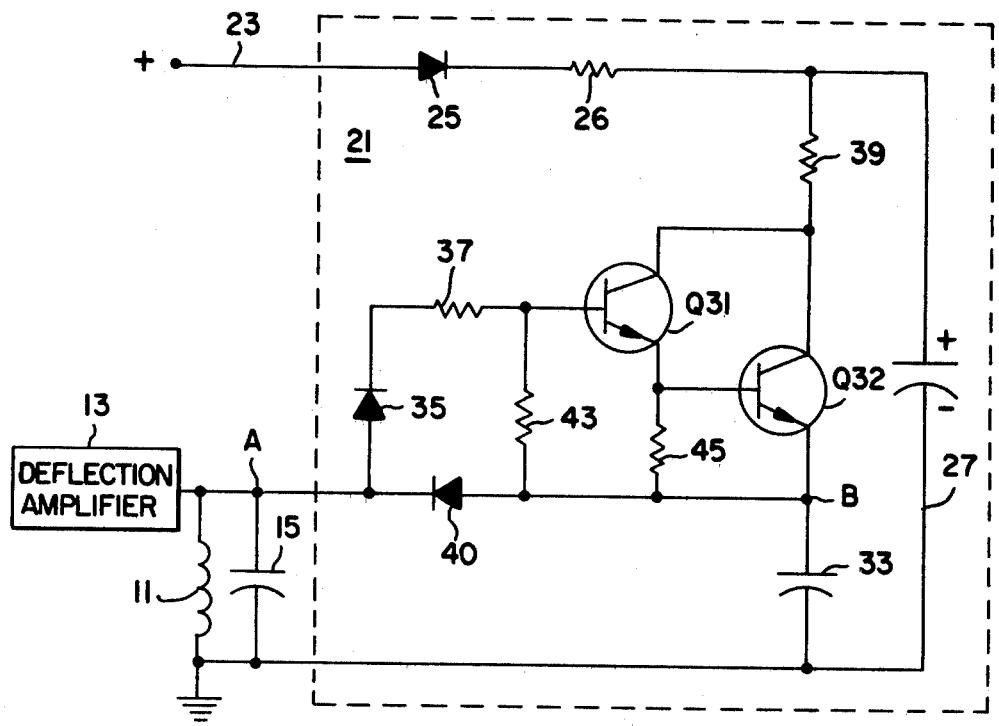
FIG. 1 is a circuit diagram of a flyback boost circuit constructed in accordance with the present invention.

Referring to FIG. 1, resonant flyback boost circuits operate in association with a deflection yoke 11, using the inductive characteristic of the yoke 11 as part of the resonant circuit. As is known to those skilled in the art, the deflection yoke is mounted on a cathode ray tube (CRT) (not shown) and serves to deflect a beam of electrons traveling toward the CRT's screen in order to create an image pattern on the CRT. The yoke 11 is driven by a driving amplifier, such as deflection amplifier 13, which changes a magnetic field of the yoke 11 in order to control the direction that the electron beam is deflected within the CRT. In a raster pattern, the image is produced as the beam is deflected across the screen in a series of lines or traces. At the end of each trace, the yoke's 11 field must be rapidly changed in order to return the yoke's magnetic field to that required to begin another trace line in the same direction as the previous trace line. This change in deflection requires an appropriate change in deflection voltage so that current flowing through the yoke 11 can be changed in accordance with the desired deflection at the beginning of the next trace. The change in deflection current is referred to as flyback.

In order to change the direction of current across the yoke 11, the deflection amplifier 13 must change its output current from a value defined by the deflection required for completion of a trace to a like value of opposite polarity, which is a deflection current required for initiating the next trace. The voltage at the beginning of each trace can either be positive or negative, depending on the arrangement of the yoke, which is decided in accordance with the configuration of the deflection amplifier 13. In describing the perferred embodiment of the invention, the current at the beginning of the trace will be described as having a positive value, it being understood that the principles of the invention also apply for a deflection amplifier which initiates a trace at a negative value. This value at the beginning of the trace will be described as +x amps with the deflection current at the termination of the trace being described as −x amps.

Figure 2:
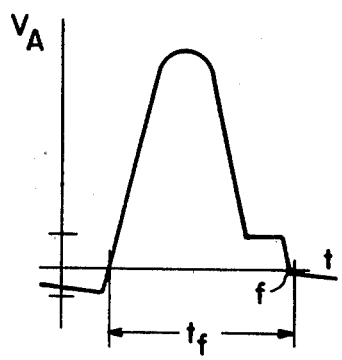
FIG. 2 graphically depicts deflection voltage verses time when a prior art resonant boost circuit of FIG. 1 is used.

During flyback, the current in the yoke 11 must change from −x to +x amps in the short time period allowed for flyback. This time period for flyback is decreased in equipment having higher raster line rates. The yoke 11 is an inductor and the resulting fast change in yoke current generates a high positive EMF (potential), measured as voltage, across the yoke 11. A capacitor 15 is connected in parallel across the yoke 11 and stores energy which is discharge through the yoke 11 toward the end of the flyback period. Referring to FIG. 2, flyback voltage versus time is depicted. The time period $t_f$ indicates the maximum flyback time allocated for a particular scan rate. At the beginning of the flyback time $t_f$, the deflection amplifier 13 attempts to apply a positive current across the yoke 11. The capacitor 15 charges to a value determined by the maximum voltage across the yoke 11 and, as the yoke 11 responds to the increased voltage across it, the capacitor 15 discharges across the yoke 11, thereby increasing the current passing through the yoke 11 during flyback. In other words, the capacitor 15 attempts to maintain the voltage across the yoke 11 at a high level. This results in a boost in the current passing through the yoke 11 to the extent that, in the time shown, full flyback is accomplished, as indicated by point f, within the flyback period $t_f$. If the flyback time period $t_f$ is decreased, then point f would have to somehow be moved to the left in order to complete the flyback cycle during the time period allocated for flyback.

Referring again to FIG. 1, a resonant flyback boost circuit 21 is used to decrease the time required to complete flyback, thereby moving point f to the left. The circuit 21 is connected to a drive voltage at a drive voltage input 23, which has a relatively high value, compared to the voltage supplied by the deflection amp 13 absent the inductive effects of the yoke 11. Typical drive voltages for the drive voltage input would be in the 50–200 volt range, although this range need not be strictly adhered to. The resonant flyback boost circuit 21 functions by increasing voltage applied to the yoke 11, which is connected to the boost circuit 21 at circuit point A. The resonant flyback boost circuit 21 functions by allowing energy to be supplied from the drive voltage input 23 to capacitor 33, and then to point A.

Current from the drive voltage input 23 is filtered by a filter diode 25, a resistor 26, and a filter capacitor 27. A Darlington pair of transistors Q31 and Q32 are used to switch the boost circuit 21 from a passive to an active status. A supplemental resonant flyback boost capacitor 33 provides the boost current when the boost circuit 21 is in a passive state, for short time period, in parallel with capacitor 15. When the deflection amp 13 initiates flyback, the voltage at A increases and is conducted through a first switching diode 35 and a resistor 37 to the base of Q31, the control transistor for the Darlington pair Q31, Q32. The collectors of the Darlington pair Q31, Q32, are provided with a potential from the drive voltage input 23, through the filter diode 25, resistor 26 and a current regulating resistor 39. When a positive voltage is present at the base of the control resistor Q31, the Darlington pair Q31, Q32 become conductive and current is allowed to flow through the pair to charge the supplemental boost capacitor 33, at circuit point B. A second switching diode 40 permits current to flow from point B, at the supplemental boost capacitor 33 to point A, provided that point A has less potential than point B. Initially, that condition does not exist because the potential at point A is relatively high in order to switch the Darlington pair Q31, Q32 on and because the supplemental boost capacitor 33 is substantially uncharged. As the potential at A falls and becomes less than the potential at B, the second switching diode 40 conducts current from B to A and the energy stored in the supplemental boost capacitor 33 combines with the energy stored in the resonant capacitor 15 to provide current to the yoke 11. As the potential at point A falls, the Darlington pair Q31, Q32 are switched off, leaving only capacitors 15, 33 to provide current to the yoke 11. Since the second switching diode 40 and resistor 37 substantially prevent current from flowing from the deflection amplifier 13 to point B, the supplemental boost capacitor 33 has an effect on the yoke 11 only during flyback time period $t_f$.

Leakage resistors 43 and 45 are connected from the base of control transistors Q31 and Q32 to point B, in order to drive the Darlington pair Q31, Q32, off after the initial potential at point A has dropped.

Figure 3:
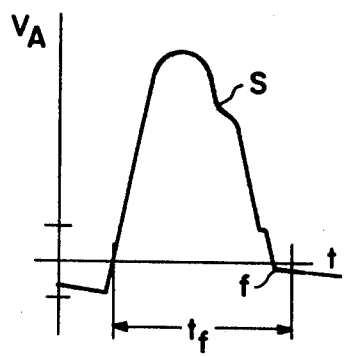
FIG. 3 graphically depicts voltage output verses time which is changed relative to the voltage output shown in FIG. 2 in accordance with the present invention.

The voltage at A (with the resonant capacitor 15) remains substantially unaffected by the boost circuit 21 until a point in time, indicated by s, after the supplemental boost capacitor 33 has had a chance to charge to a potential, such that the potential at B exceeds that of A. The point s at which the boost circuit 21 provides additional current to the yoke 11 usually occurs after the initial potential applied to the yoke 11 has peaked. As can be seen in FIG. 3, the boost circuit 21 has the effect of maintaining the potential at A at an elevated level for a longer period of time. This causes the current through the yoke 11 to change more rapidly, thereby completing the flyback, indicated by point f on the graph, at an earlier time. This allows the time for completion of flyback $t_f$ to be reduced. The characteristic of the voltage curve indicated in FIG. 3 can be modified by changing the values of the various elements. The drive voltage applied to the drive voltage input 23 and the closed circuit resistances of the elements between input 23 and point B determine the rate of charge of the capacitor 33. The value of the capacitor 33, of course, determines the storage capacity. The values of the control resistor 37 and leakage resistors 43 and 45, control the "on" time of the Darlington pair Q31, Q32. The effects of the resonant capacitor 15, as well as the electrical characteristic of the deflection amplifier 13 and the yoke 11 must also be considered in establishing voltage levels for flyback.

It should be noted that it is not necessary to use a Darlington pair Q31, Q32 in order to operate the boost circuit 21. A single active switching element can be substituted for the Darlington circuit. By using the Darlington pair Q31, Q32, a high input impedance is presented by the boost circuit 21, as viewed from the yoke 11, between point A and ground. The second switching diode 40 further serves to maintain a high input impedance for the boost circuit 21, as viewed from the yoke 11, except at times when the boost circuit 21 is providing current across the diode 40. Thus, the boost circuit 21 can remain in a quiescent mode at times other than during flyback and not affect deflection of the yoke 11 during forward scanning and stroke writing modes of operation.

The boost circuit 21 is preferably connected across a yoke such as yoke 11 which has a ground connection or similar reference potential. It is also possible to operate the circuit 21 with a separate synchronization (sync) pulse in systems having an appropriate output. Such a sync pulse signal would be typically applied to the base of the control transistor Q31. That connection is not shown in the preferred embodiment and appropriate isolation and biasing would be required, as is known to those skilled in the art. While the boost circuit 21 is shown and described as applying a positive potential, it is also possible to use the inventive concepts in a negative boost circuit.

The present invention can also be applied to other loads. For example, referring to FIG. 1, a winding for a motor (not shown) can be substituted for the yoke 11, and a motor control circuit can be used in place of the deflection amplifier 13. In that case, rapid speed changes, such as start-up or reversal would result in a high positive EMF, which appears at point A. Likewise, the present invention can be used to drive electron beam deflectors other than the CRT yoke 11 of the preferred embodiment. While the present invention has been described in terms of distinct elelments, it is anticipated that integrated circuitry will be used to accomplish the desired results of the invention. Accordingly, the present invention should be read as limited only by the claims.

What is claimed is:

1. A flyback boost circuit for use with a video system having a magnetic deflection coil yoke, characterized by:
   (a) a boost capacitor;
   (b) first gating means, connected to the boost capacitor in a series circuit, the series circuit being connected in parallel with the yoke;
   (c) a power source;
   (d) second gating means connected to the power source and to a point between the first gating means and the boost capacitor so that, when the second gating means is conducting, the second gating means is able to charge the boost capacitor; and
   (e) means to control the second gating means so as to admit current to the boost capacitor when the video system is in its flyback mode, wherein the first gating means admits current from the boost capacitor to the yoke when a potential across the boost capacitor exceeds a potential across the yoke.

2. Apparatus as described in claim 1, further characterized by:
   the means to control the second gating means including a third gating means which admits current from the yoke when the potential across the yoke reaches a predetermined value.

3. Apparatus as described in claim 2, further characterized by:
   the first gating means being a diode and the second gating means including a switching elelment.

4. Apparatus as described in claim 2, further characterized by:
   (a) the first gating means being a diode;
   (b) the second gating means including a switching element; and
   (c) the third gating means including a diode, wherein when the potential across the yoke exceeds a predetermined value, the third gating means conducts to the second gating means, signaling the second gating means to conduct current between the high voltage source and the boost capacitor.

5. Apparatus as described in claim 2, further characterized by:
   the second gating means including a Darlington switching circuit.

6. Apparatus as described in claim 4, further characterized by:
   the second gating means including a Darlington switching circuit.

7. Apparatus as described in claim 1, further characterized by:
   a supplemental resonant capacitor parallely connected across the yoke.

8. Apparatus as described in claim 4, further characterized by:
   a supplemental resonant capacitor parallely connected across the yoke.

9. Method for enhancing flyback performance in a video system having a magnetic deflection coil yoke, characterized by:
   (a) sensing a rise in potential across the yoke;
   (b) charging a boost capacitor from a high voltage power source by gating a connection, between the high voltage power source and the boost capacitor, on when said voltage rise is sensed;
   (c) gating current off between the boost capacitor and the yoke when the potential across the yoke exceeds a potential across the capacitor;
   (d) gating current on between the boost capacitor and the yoke when the potential across the boost capacitor exceeds the potential across the yoke; and
   (e) gating the connection off between the high voltage power source and the boost capacitor when the potential across the yoke has decreased.

10. A boost circuit for assisting a rapid change of current flow in an inductive load characterized by:
    (a) a boost capacitor;
    (b) first gating means, being connected to the boost capacitor in a series circuit, the series circuit being connected in parallel with the inductive load;
    (c) a high voltage power source;
    (d) second gating means connected to the high voltage power source and to a point between a first gating means and the boost capacitor so that, when the second gating means is conducting, the second gating means is able to charge the boost capacitor; and
    (e) means to control the second gating means so as to admit current to the boost capacitor when the rapid change in current flow is desired, wherein the first gating means admits current from the boost capacitor to the inductive load when a potential across the boost capacitor exceeds a potential across the inductive load.

11. Apparatus as described in claim 10, further characterized by:
    the means to control the second gating means including a third gating means which admits current from the inductive load when the potential across the inductive load reaches a predetermined value.

12. Apparatus as described in claim 11, further charaterized by:
    the first gating means being a diode and the second gating means including a switching element.

13. Apparatus as described in claim 11, further characterized by:
    (a) the first gating means being a diode;

(b) the second gating means including a switching element; and
(c) the third gating means including a diode, wherein when the potential across the inductive load exceeds a predetermined value, the third gating means conducts to the second gating means, signaling the second gating means to conduct current between the high voltage source and the boost capacitor.

14. Apparatus as described in claim 11, further characterized by:
    the second gating means including a Darlington switching circuit.

15. Apparatus as described in claim 13, further characterized by:
    the second gating means including a Darlington switching circuit.

16. Apparatus as described in claim 10, further characterized by:
    the inductive load being an electron beam deflector.

17. Apparatus as described in claim 13, further characterized by:
    the inductive load being an electron beam deflector.

18. Apparatus as described in claim 10, further characterized by:
    the inductive load being an electric motor winding.

19. Apparatus as described in claim 13, further characterized by:
    the inductive load being an electric motor winding.

20. A boost circuit for effecting rapid changes in an inductive load, characterized by:
    (a) a boost capacitor;
    (b) first gating means, connected to the boost capacitor in a series circuit, the series circuit being connected in parallel with the load;
    (c) a high voltage power source; and
    (d) amplifier means connected to the high voltage power source and the boost capacitor and responsive to a potential across the load, the amplifier means providing current to the boost capacitor in response to said potential across the load, wherein
    (e) the first gating means admits current from the boost capacitor to the load when a potential across the boost capacitor exceeds said potential across the load.

* * * * *